(12) United States Patent
Park et al.

(10) Patent No.: US 6,397,367 B1
(45) Date of Patent: May 28, 2002

(54) DEVICE AND METHODS FOR CHANNEL CODING AND RATE MATCHING IN A COMMUNICATION SYSTEM

(75) Inventors: Chang-Soo Park, Seoul; Hyeon-Woo Lee, Suwon, both of (KR)

(73) Assignee: Samsung Electronics, Co., Ltd. (KR)

( * ) Notice: Subject to any disclaimer, the term of this patent is extended or adjusted under 35 U.S.C. 154(b) by 0 days.

(21) Appl. No.: 09/326,891

(22) Filed: Jun. 7, 1999

(30) Foreign Application Priority Data

Jun. 5, 1998 (KR) ............................................ 98/20990

(51) Int. Cl.[7] ........................ H03M 13/23; H03M 13/27
(52) U.S. Cl. ........................ 714/786; 375/265; 714/792
(58) Field of Search ................................. 714/786, 790, 714/792; 375/265

(56) References Cited

U.S. PATENT DOCUMENTS

| | | | | |
|---|---|---|---|---|
| 5,436,918 A | * | 7/1995 | Kato et al. | ..................... 371/43 |
| 5,878,085 A | * | 3/1999 | McCallister et al. | ........ 375/280 |
| 5,944,849 A | * | 8/1999 | Sonetaka | .................... 714/786 |
| 6,081,921 A | * | 6/2000 | Simanapalli | ................ 714/786 |
| 6,141,353 A | * | 10/2000 | Li | ................................ 370/465 |
| 6,166,667 A | * | 12/2000 | Park | ............................ 341/94 |

OTHER PUBLICATIONS

Brissett et al., "Unequal Error Protection using Convolutional Codes", Proc. IEEE Southeastcon '96, pp. 242–245.*
Frenger et al., "Rate Matching in Multichannel Systems using RCPC–Codes", IEEE 1997 Vehicular Technology Conference, pp. 354–357.*

* cited by examiner

Primary Examiner—Stephen M. Baker
(74) Attorney, Agent, or Firm—Dilworth & Barrese, LLP

(57) ABSTRACT

A channel coding device is disclosed. In the device, a bit inserter inserts known bits in an input data bit stream at predetermined positions. A channel coder codes the bit-inserted data bit stream to generate coded symbols. A rate matcher matches a rate of the coded symbols to a given channel symbol rate. A channel interleaver interleaves the rate matched channel symbols. The rate matcher includes a puncturer for puncturing the inserted known bits included in the coded symbols when the coded symbol rate is higher than the given channel symbol rate. The rate matcher includes a repeater for repeating the coded symbols to match the coded symbol rate to the given channel symbol rate when the coded symbol rate is lower than the given channel symbol rate.

38 Claims, 16 Drawing Sheets

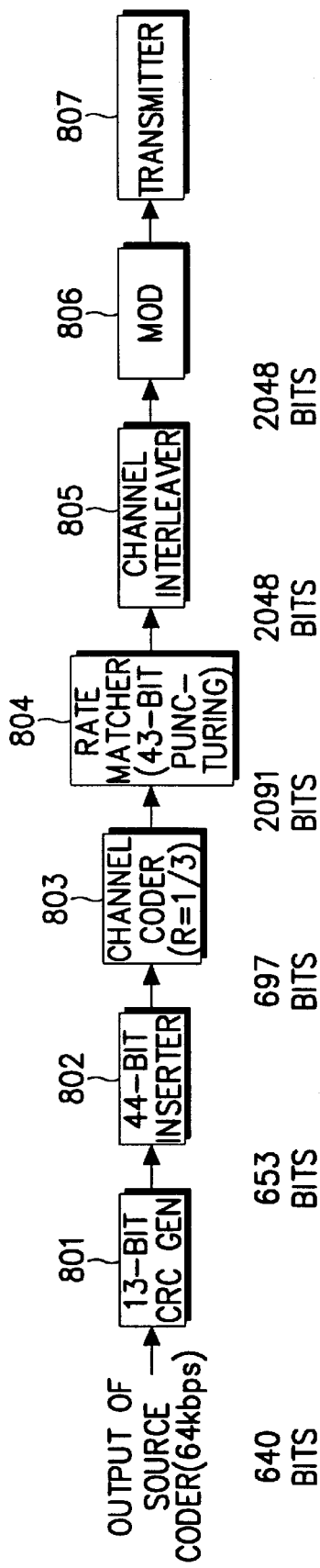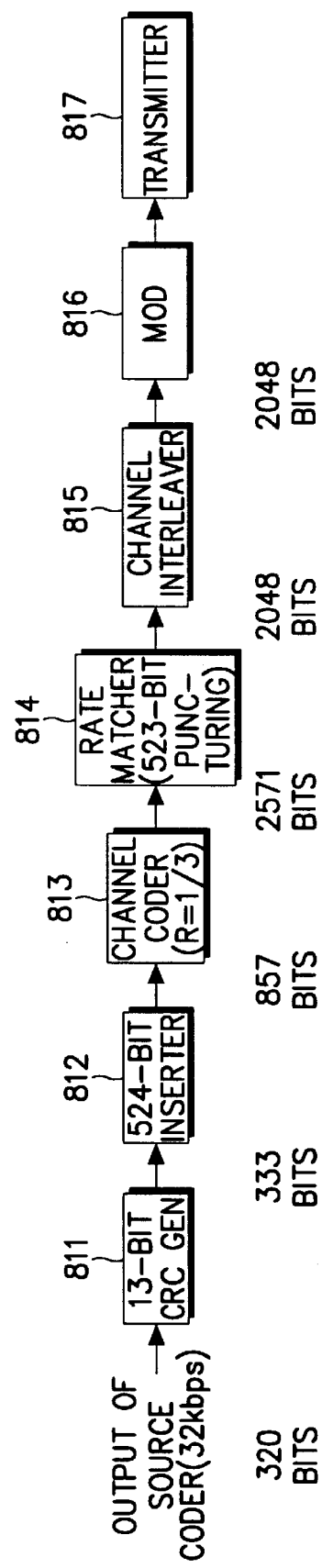

US 6,397,367 B1

DEVICE AND METHODS FOR CHANNEL CODING AND RATE MATCHING IN A COMMUNICATION SYSTEM

PRIORITY

This application claims priority to an application entitled "Channel Coding Device and Method" filed in the Korean Industrial Property Office on Jun. 5, 1998 and assigned Ser. No. 98-20990, the contents of which are hereby incorporated by reference.

BACKGROUND OF THE INVENTION

1. Field of the Invention

The present invention relates generally to a channel coding device and method for a communication system. Specifically, the present invention relates to a rate matching device and methods for inserting known bits in an input source data bit stream, channel coding the bit-inserted data stream and then, puncturing the channel coded data symbols.

2. Description of the Related Art

In a communication system, a rate of source user data is changed to a rate of channel symbols during data transmission via a channel. Particularly, in a spread spectrum communication system, since a chip rate for spreading is fixed, a channel symbol rate should be changed in order to be a multiple of the chip rate after multiplexing various service channels. Such a procedure is called rate matching.

With reference to FIG. 1, there is illustrated a block diagram of a conventional rate matching scheme for a source data rate of 64 Kbps. A CRC (Cyclic Redundancy Code) generator 101 adds 13 CRC bits to source coded user data input. A rate ⅓ (R=⅓) channel coder 102 codes the CRC-added data into 653×3=1959 symbols. Herein, a description will be made regarding a method of changing the number of data symbols to be transmitted from 1959 symbols to 2048 symbols. To this end, a rate matcher 103 repeats 89 symbols. However, a simple symbol repetition may cause degradation in performance of the system according to a channel condition as discussed in CSELT, "Power Control Parameters Optimization in W-CDMA Down-Link", SMG2 Layer 1 Expert Group Agenda Item 7, Oslo, Apr. 1–2, 1998 (the CSELT Reference).

The channel coder 102 of FIG. 1 includes a convolutional coder, a Reed-Solomon coder, a concatenated coder in which the convolutional coder is coupled to the Reed-Solomon coder, and a turbo coder in which plural convolutional coders are coupled in series or parallel. Herein, a detailed description of the respective coders will be avoided for convenience. Instead, a description will be made as to the turbo coder. The turbo coder, a parallel concatenated coder, codes N-bit frame data into parity symbols using two simple parallel concatenated codes, wherein recursive systematic convolutional (RSC) codes are generally used for the constituent codes.

FIGS. 2 and 4 are block diagrams illustrating a conventional turbo coder and a turbo decoder, respectively. Reference can be made to U.S. Pat. No. 5,446,747 issued on Aug. 29, 1995 to Berrou for a comprehensive description. The turbo coder of FIG. 2 includes a first constituent coder 201, a second constituent coder 202, and an interleaver 211 interconnected between the constituent coders 201 and 202. For the first and second coders 201 and 202, an RSC coder is typically used, which is well-known in the art. The interleaver 211 has the same size as a frame length, N, of input data bit stream $d_k$, and changes arrangement of the input data bit stream $d_k$ to be provided to the second constituent coder 202 to decrease the correlation among the data bits. Therefore, an output parallel concatenated code for the input data bit stream $d_k$ becomes $x_k$ (i.e., $d_k$ without modification) and $y_{1k}$, and $y_{2k}$.

A turbo decoder for decoding the output of the turbo coder of FIG. 2 is disclosed in U.S. Pat. No. 5,446,747, and schematically illustrated in FIG. 4. Since the turbo decoder iteratively decodes received data in a frame unit using a MAP (Maximum A Posterior Probability) decoding algorithm, an increase in frequency of iterative decoding will decrease a bit error rate (BER). For the turbo decoder, a MAP decoder or a SOVA (Soft-Out Viterbi Algorithm) decoder is typically used, which can provide soft-decision iterative decoding.

FIG. 3 illustrates a convolutional coder with a constraint length 9 (K=2) and a coding rate ⅓ (R=⅓). For decoding an output of the convolutional coder, a Viterbi decoder is generally used which employs a Viterbi algorithm. A detailed description of the Viterbi decoder is avoided herein.

FIG. 5 is a block diagram illustrating a transmission part of a known communication system, which multiplexes user data and control data and transmits the multiplexed data. The user data is coded by a first source coder 501 and a first channel coder 502. Further, the control data is coded by a second source coder 511 and a second channel coder 512 and then multiplexed with the coded user data by a multiplexer 503. The multiplexed user data and control data is rate matched at a rate matcher 504 by symbol repetition, puncturing or puncturing-after-symbol repetition. The rate matched symbols are provided to a transmitter 507 via a channel interleaver 505 and a modulator 506.

FIG. 6 is a block diagram illustrating a transmission part of another known communication system which multiplexes first and second user data and control data and transmits the multiplexed data. The first and second user data are channel coded by first and second channel coders 602 and 612, respectively, and then, rate matched by first and second rate matchers 603 and 613 according to their service option and class by symbol repetition, puncturing or puncturing-after-symbol repetition. Similarly, the control data is channel coded by a third channel coder 622 and then, rate matched by a third rate matcher 623. Outputs of the first to third rate matchers 603, 613 and 623 are multiplexed by a multiplexer 604 and then, finally rate matched by a channel rate matcher 605. The channel rate matched symbols are provided to a transmitter 608 via a channel interleaver 606 and a modulator 607.

A description will now be made as to symbol repetition performed for matching rates of symbols outputted from the channel coders 602, 612 and 622. A simple repetition of the channel coded symbols is a very simple symbol repetition method. However, the simple symbol repetition is not suitable for error correction. This is because in the light of the channel coded symbols, although a BER for the case where all the symbols are repeated two times (i.e., a rate ½) is similar to a BER for the case where the symbols are not repeated (i.e., a rate 1), a performance degradation may occur according to a channel condition in the case where the respective symbols are unequally repeated (see the CSELT Reference). Therefore, when unequal symbol repetition is performed for rate matching, efficiency of the overall system typically decreases.

Further, reference will be made to a turbo coder of FIG. 2 having a constraint length 3 (K=3). Outputs of the turbo coder include non-coded data bit $x_k$ and channel coded data parity bits $y_{1k}$ and $y_{2k}$. When the data bit $x_k$ is punctured for rate matching or various symbol rates, performance degradation is significant. In addition, when the parity bits $y_{1k}$ and $y_{2k}$ are simultaneously punctured at a time k, there exist no parity bits for a data bit at the time k. In the K=3 turbo coder, when the same parity bits $y_{1k}$ and $y_{1k+1}$ or the same parity bits $y_{2k}$ and $y_{2k+1}$ are simultaneously punctured, there exist no parity bits for data bits at the time k and k+1, so that a performance degradation occurs even though iterative decoding is performed. That is, when the parity bits outputted from the first and second constituent coders are consecutively punctured as many as the number of memories in the turbo coder, performance degradation occurs.

Therefore, for rate matching which requires symbol repetition, it is possible to guard against performance degradation by providing a channel coder which inserts specific bits in an input data bit stream and encodes the bit-inserted data bit stream. It is assumed herein that a value of the specific bits and bit inserting positions where the specific bits are to be inserted are known to both a transmission party and a reception party. Moreover, when puncturing is required for the channel coded symbols, the turbo coder selects puncturing positions for the parity bits, such that performance degradation due to puncturing is minimized.

SUMMARY OF THE INVENTION

It is, therefore, an object of the present invention to minimize performance degradation of a communication system during symbol repetition, puncturing and puncturing-after-symbol repetition in a rate matching device.

It is another object of the present invention to provide a rate matching device and method for inserting known bits in an input source data bit stream, channel coding the bit-inserted data bit stream and thereafter puncturing the channel coded data symbols.

It is further another object of the present invention to minimize performance degradation caused during puncturing by selecting acceptable symbol puncturing positions when performing rate matching for input channel coded symbols.

To achieve the above objects, there is provided a channel coding device. In the device, a bit inserter inserts known bits in an input data bit stream at predetermined positions. A channel coder codes the bit-inserted data bit stream to generate coded symbols. A rate matcher matches a rate of the coded symbols to a given channel symbol rate. A channel interleaver interleaves the rate matched channel symbols. The rate matcher includes a puncturer for puncturing the inserted known bits included in the coded symbols when the coded symbol rate is higher than the given channel symbol rate. The rate matcher includes a repeater for repeating the coded symbols to match the coded symbol rate to the given channel symbol rate when the coded symbol rate is lower than the given channel symbol rate.

BRIEF DESCRIPTION OF THE DRAWINGS

The above and other objects, features and advantages of the present invention will become more apparent from the following detailed description when taken in conjunction with the accompanying drawings, in which:

FIG. 8A is a block diagram illustrating a rate matching scheme where a source coder has a data rate of 64 Kbps;

FIG. 8B is a block diagram illustrating a rate matching scheme where a source coder has a data rate of 32 Kbps;

DETAILED DESCRIPTION OF THE PREFERRED EMBODIMENTS

Preferred embodiments of the present invention will be described herein below with reference to the accompanying drawings. In the following description, well known functions or constructions are not described in detail since they would obscure the invention in unnecessary detail.

It is assumed herein that a K=3 RSC coder is used for both first and second constituent coders. A soft-decision iterative decoder is used for the first and second constituent coders. Further, a MAP or SOVA decoder can be used for the soft-decision iterative decoder. In addition, not only an RSC coder but also a non-RSC coder can be used for the first and second constituent coders. Moreover, the first and second constituent coders may use different constraint lengths and generator polynomials.

A. First Embodiment

Figure 7:
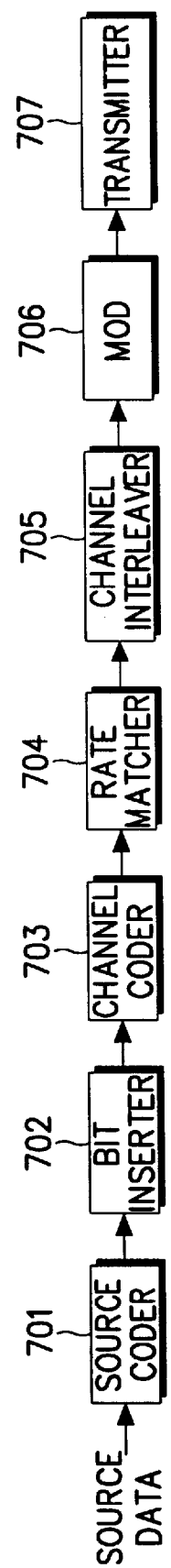
FIG. 7 is a block diagram illustrating a transmission part of a communication syste m according to a first embodiment of the present invention.

FIG. 7 is a block diagram illustrating a rate matching scheme for a channel coding device according to a first embodiment of the present invention. A source coder 701 codes input source data according to a predetermined coding method. Here, the source data includes user data and control data. A bit inserter 702 inserts a predetermined number of known bits in the coded source data at predetermined positions, in order to transmit the coded source data at a specific data rate. The number of the inserting bits and the positions where the inserting bits are inserted, are previously scheduled with receiving devices. A channel coder 703 codes the data outputted from the bit inserter 702 at a specific coding rate and outputs coded symbols (including data symbols and parity symbols). A turbo coder or a convolutional coder can be used for the channel coder 703.

A rate matcher 704 matches a rate of symbol data outputted from the channel coder 703 to a symbol rate of the transmission channel. The rate matcher 704 can be composed of a repeater and a puncturer. Also, the rate matcher 704 can be composed of any one of the repeater and the puncturer. A channel interleaver 705 interleaves the rate matched symbols. A modulator 706 modulates the channel interleaved symbol data. The modulator 706 may employ code division multiple access (CDMA) modulation techniques. A transmitter 707 converts the modulated transmission data to an RF signal and transmits the converted RF signal.

When a coded symbol rate is higher than a given channel symbol rate, the rate matcher 704 can be implemented by a puncturer for puncturing the symbols. However, when the coded symbol rate is lower than the given channel symbol rate, the rate matcher 704 can be implemented by a repeater for repeating the symbols to match the coded symbol rate to the given channel symbol rate. Alternatively, when the coded symbol rate is lower than the given channel symbol rate, the rate matcher 704 can be implemented by a repeater for repeating the symbols to approximately match the symbol rate to the given symbol rate and a puncturer for matching a rate of the repeated symbols to the given channel symbol rate.

For the channel coder 703, a K=3 turbo coder or a K=9 convolutional coder can be used.

In addition, a portion having a high error occurrence probability of an overall input data frame can be reinforced during bit insertion. With respect to performance of the channel coder, since a previously known value, i.e., a high reliability is used during decoding, an error rate is reduced in finding a survival path on a trellis of a decoder. The bit insertion technique which uses the bits previously known to both the transmission party and the reception party provides a higher performance at all the traveling velocities, and an increase in the number of the inserting bits increases the performance. Further, the bit inserter can vary the number of inserting bits according to a service option and class for the source user data or according to a service option and class for the control data.

The bit-inserted input data is channel coded by the channel coder 703 and the channel coded symbols are provided to the rate matcher 704 which matches a rate of the channel coded symbols to a specific symbol rate by puncturing. This procedure will be described below, by way of example.

FIG. 8A is a block diagram illustrating a rate matching procedure in the case where the source coder 701 has a data rate 64 Kbps, and FIG. 8B is a block diagram illustrating a rate matching procedure in the case where the source coder 701 has a data rate 32 Kbps. It is assumed herein that a K=3 turbo coder is used for the channel coder 703. A CRC generator 801 adds 13 CRC bits to 640 bits per frame (i.e., data rate of 64 Kbps) outputted from the source coder 701 to output 653 bits. A bit inserter 802 inserts 44 bits of "0" or "1" in data outputted from the CRC generator 801 to output 653+44=697 bits. An R=⅓ channel coder 803 encodes the 697 bits into 2091 symbol bits (697×3=2091). A rate matcher 804 punctures 43 bits inserted in the data outputted from the source coder 701 to output 2091−43=2048 bits.

Since the transmission party and the reception party both know the value and positions of the 43 bits inserted in the data outputted from the source coder 701, it is not necessary to actually transmit the bits via the channel. Therefore, the rate matcher 804 outputs 2048 rate matched symbols by puncturing 43 inserted bits. Since this technique provides many data bits previously known to both the transmission party and the reception party, an error probability is drastically reduced in tracing a survival path on a trellis during decoding. The number of the inserting bits varies according to a data rate.

Referring to FIG. 8B, there is illustrated a rate matching scheme in the case where the source coder 701 has a data rate of 32 Kbps. In this case, a bit inserter 812 inserts 524 bits in 333-bit frame data outputted from a CRC generator 811 to output 857 bits, and an R=⅓ channel coder 813 encodes the 857 bits into 2571 symbol bits (857×3=2571). A rate matcher 814 punctures 523 symbols from the 2571 symbols to output 2048 symbols.

In the meantime, when a turbo coder is used for the channel coder 703 of FIG. 7, the turbo coded symbols assume the recursive systematic form, so that a data bit $x_k$ is transmitted, as it is, without coding. In the case where the data bit $x_k$ for a turbo code is punctured for rate matching, performance degradation becomes more significant as compared with the case where other parity bits are punctured. Therefore, it is preferable not to puncture the data bit $x_k$.

Figure 1:
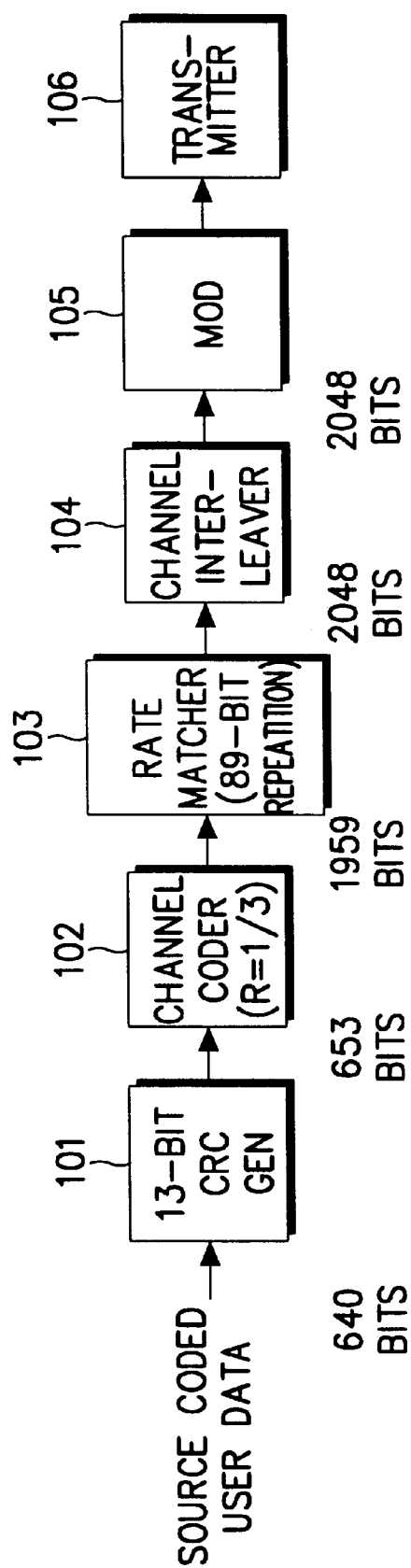
FIG. 1 is a block diagram illustrating a conventional rate matching scheme for a date rate of 64 Kbps.
Figure 2:
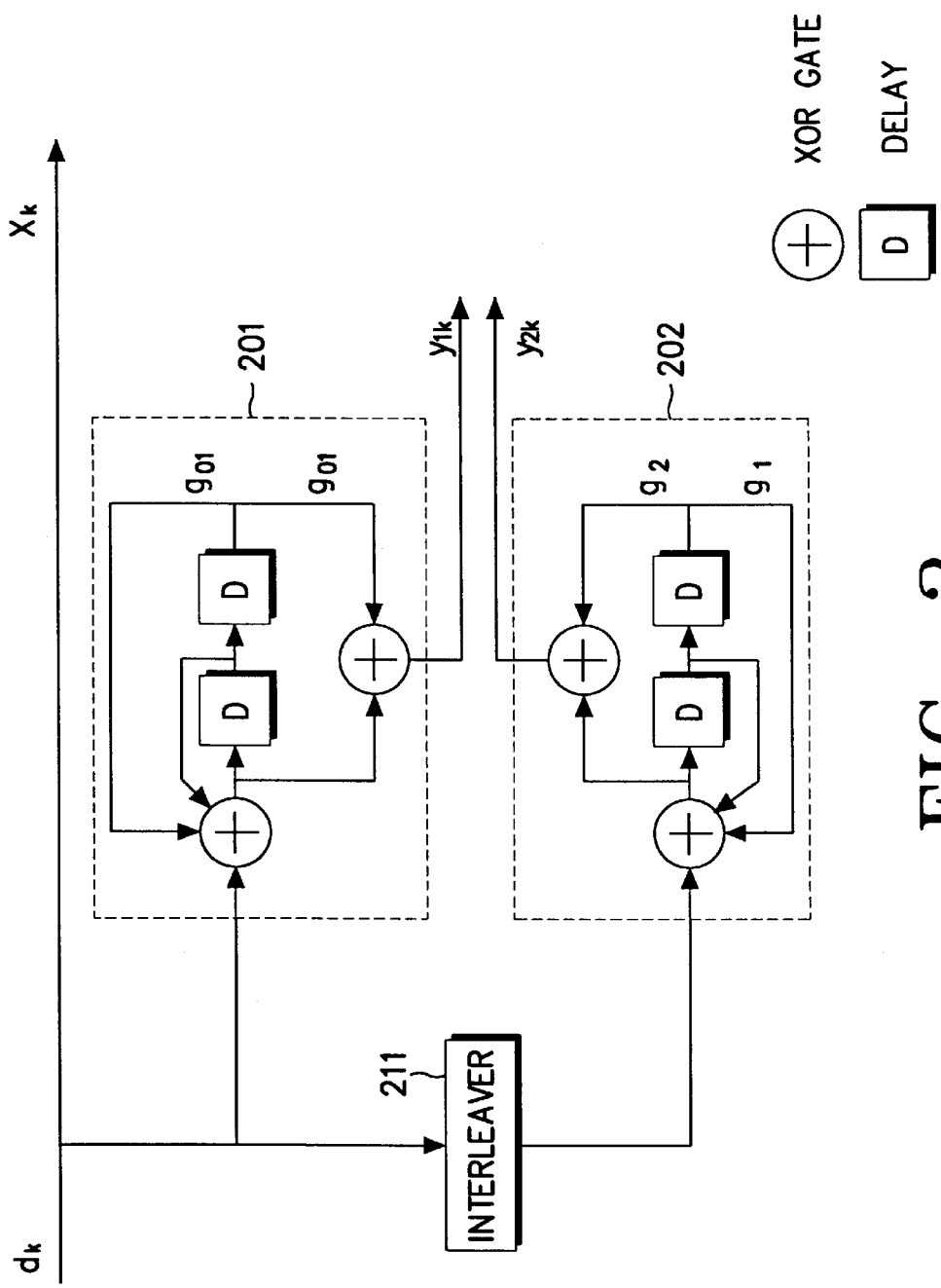
FIG. 2 is a block diagram illustrating a conventional turbo coder.
Figure 3:
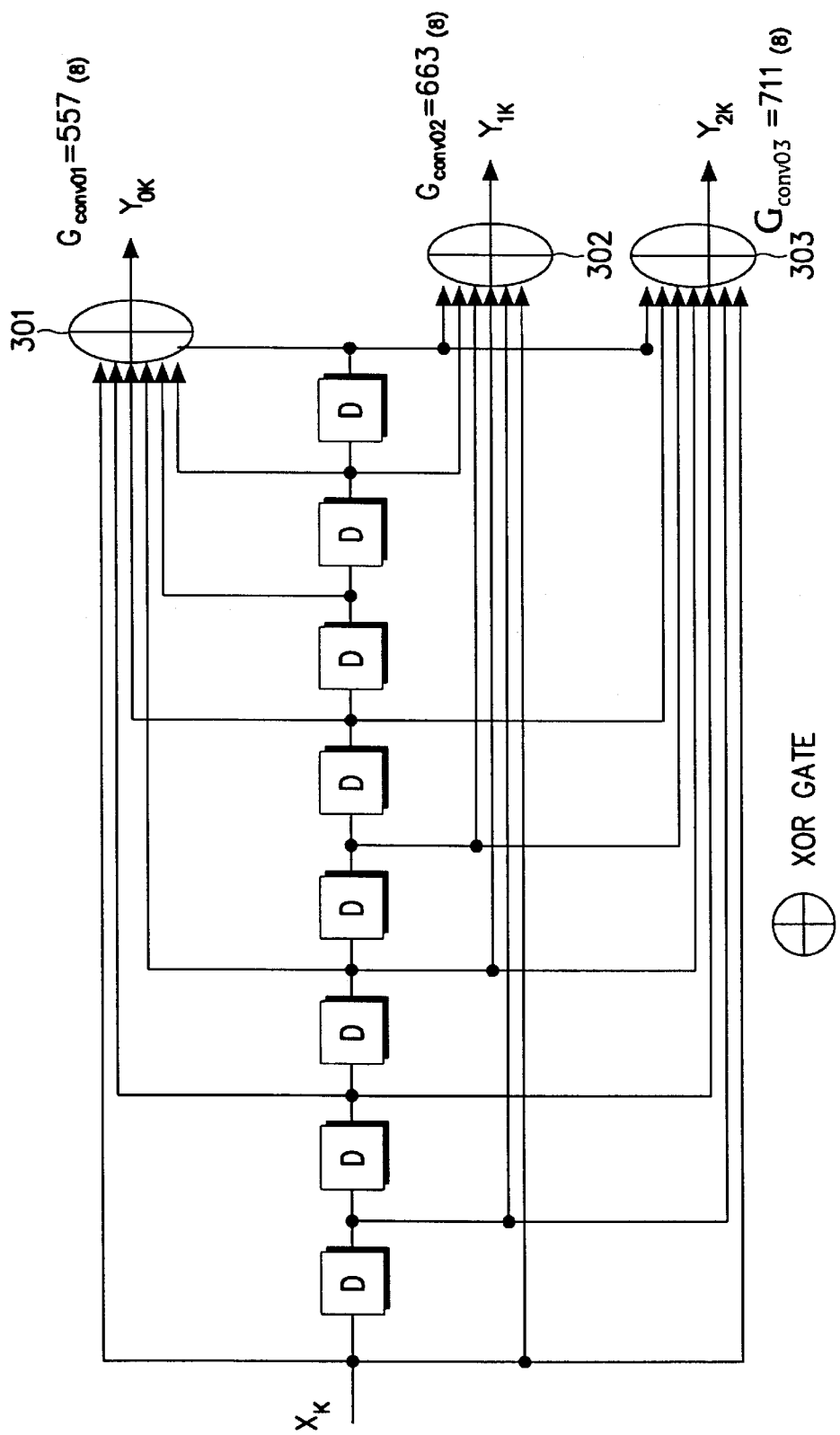
FIG. 3 is a diagram illustrating a conventional convolutional coder.
Figure 4:
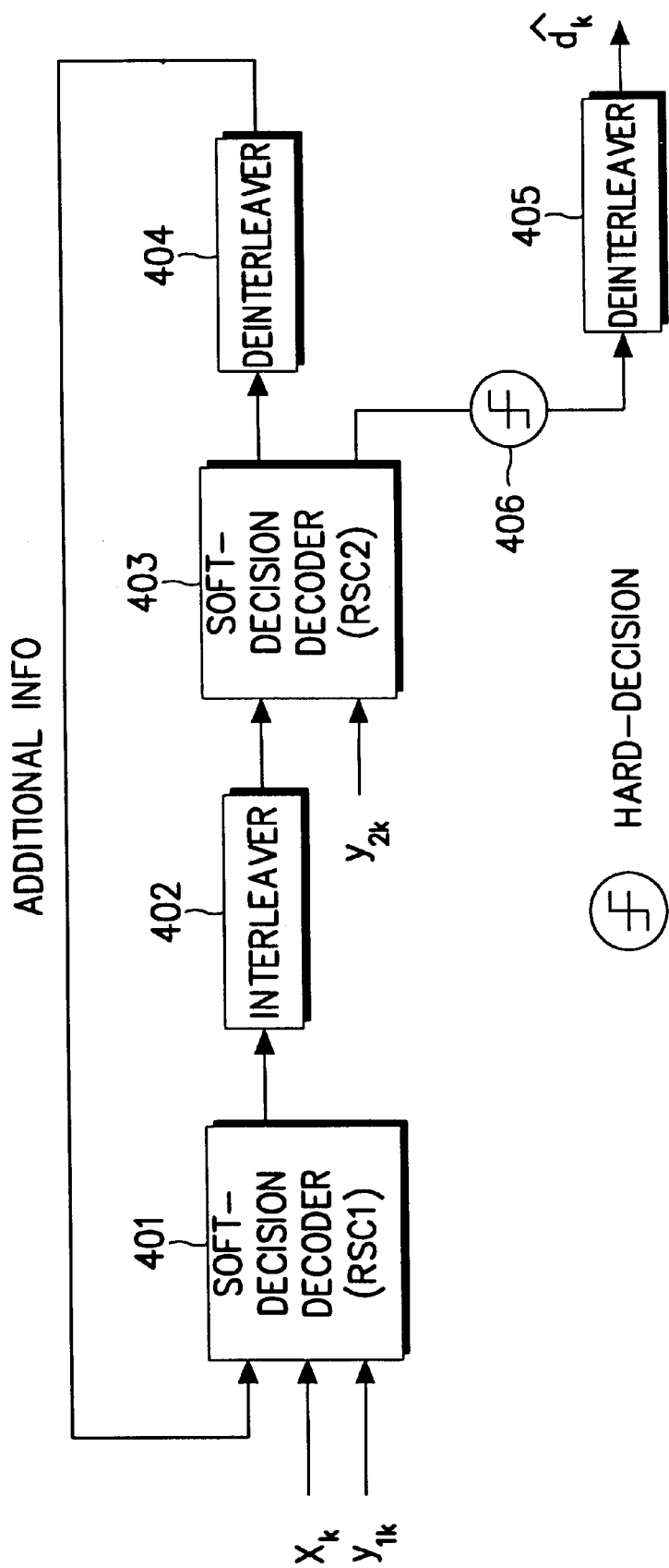
FIG. 4 is a block diagram illustrating a conventional turbo decoder.
Figure 5:
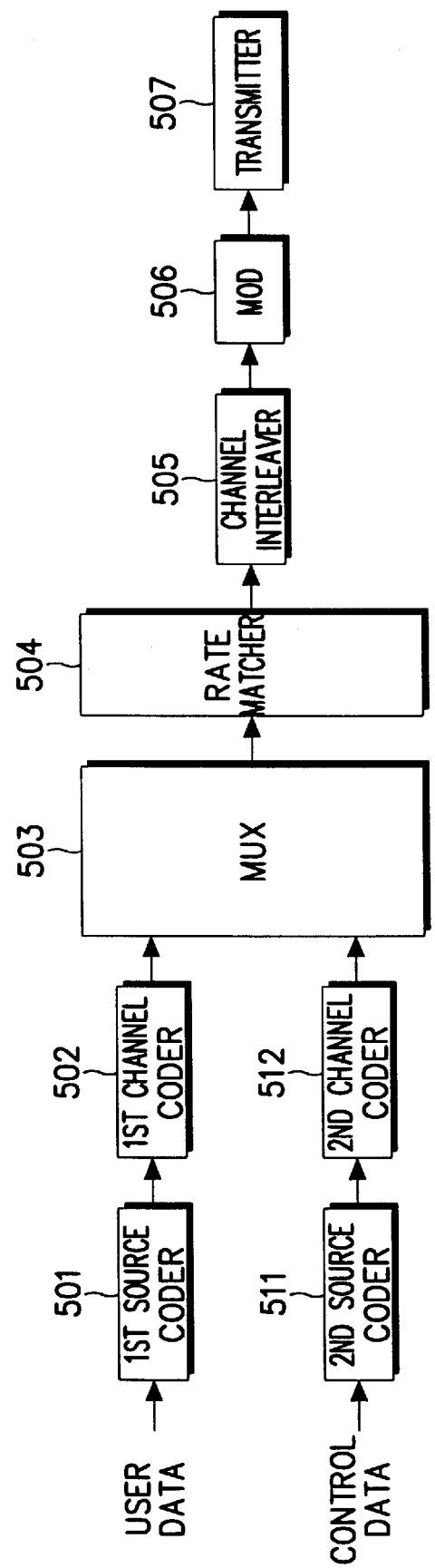
FIG. 5 is a block diagram illustrating a transmission part of a conventional communication system.
Figure 6:
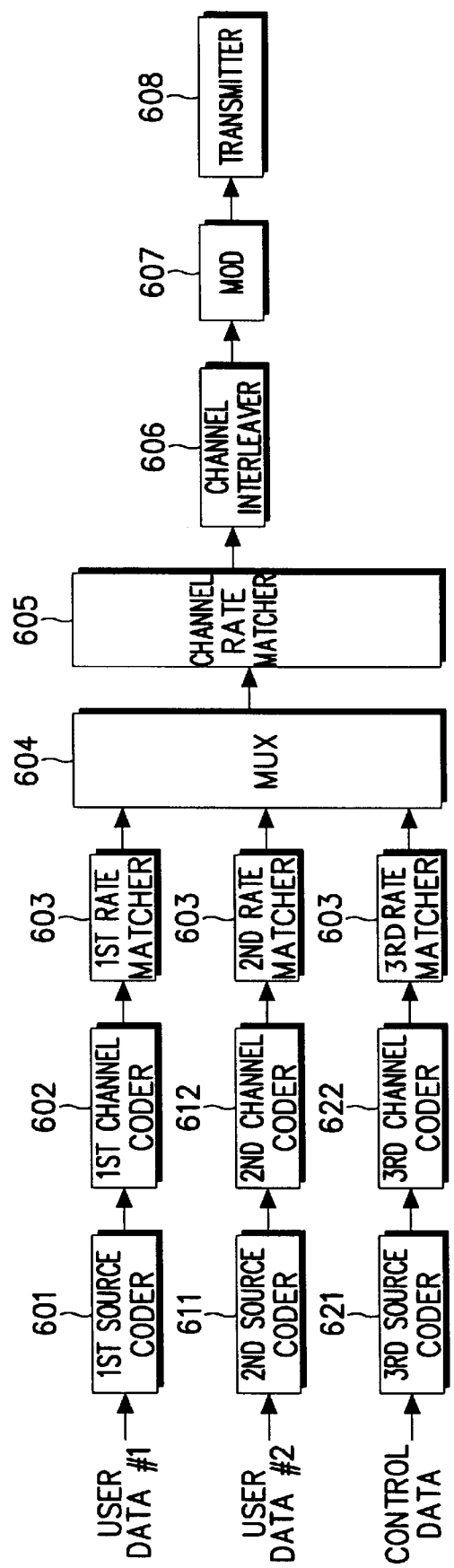
FIG. 6 is a block diagram illustrating a transmission part of an another conventional communication system.

Further, in the conventional turbo coder of FIG. 2, when the parity bits outputted from the first constituent coder 201 for the K=3 turbo coder are consecutively punctured at time k and k+1 there exist no parity bits for the data bit $x_k$ at a time k. This is the same even for the second constituent coder 202. In addition, when a parity bit $y_{1k}$ from the first constituent coder 201 and a parity bit $y_{2k}$ from the second constituent coder 202 are both punctured at time k, there exist no parity bits for decoding the data bit $x_k$ at time k. Therefore, to solve this problem, the parity bits from the first or second constituent coder 201 or 202 should not be consecutively punctured. In addition, the parity bits from the first and second constituent coders 201 and 202 should not be punctured simultaneously.

In general, a transmission party exchanges rate information with a reception party in the process of call setup. However, when the rate information is not directly transmitted from the transmission party to the reception party, the reception party decodes a received signal according to predetermined various data rates and thereafter, checks a CRC included in the received data frame to detect the data rate. Therefore, in a system where a rate is matched by inserting specific bits in a data bit stream, when the reception party cannot be directly provided with the rate information in the call setup process, the reception party can perform decoding by changing the number of inserting bits, which is predetermined according to the data rate, and thereafter, checks a CRC in the data frame to determine where the data rate has an error.

B. Second Embodiment

Figure 9:
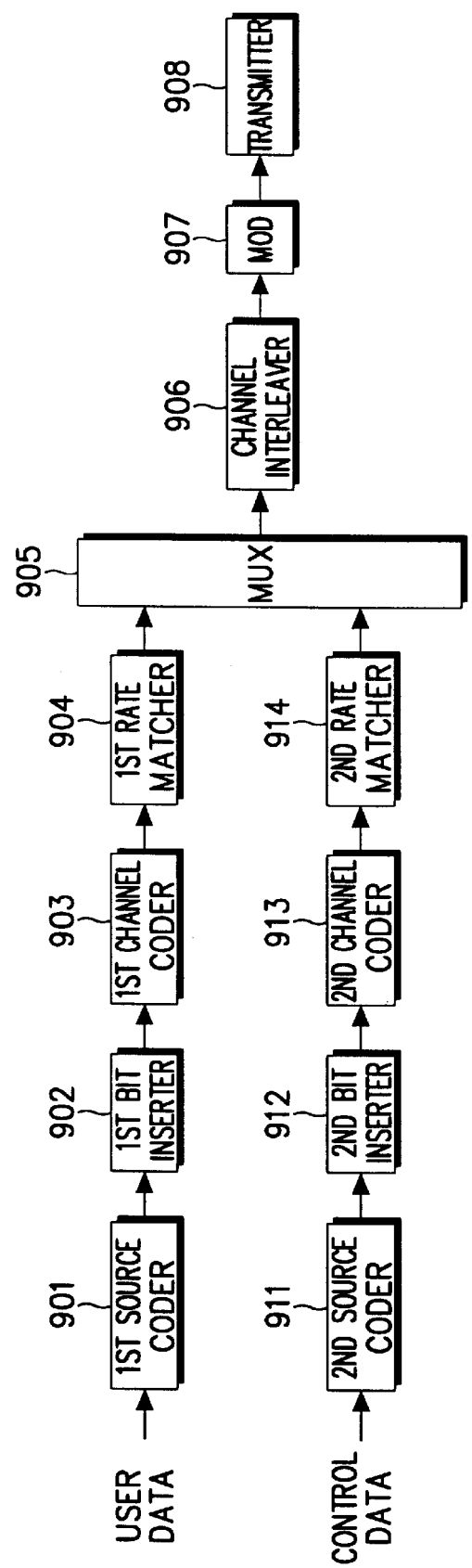
FIG. 9 is a block diagram illustrating a transmission part of a communication system according to a second embodiment of the present invention.

With reference to FIG. 9, there is shown a block diagram of a rate matching scheme for a channel coding device according to a second embodiment of the present invention. The channel coding device inserts known bits at predetermined positions, for rate matching for both user data and control data.

A first source coder 901 codes input source user data according to a predetermined coding method. A first bit inserter 902 inserts a predetermined number of known bits in the coded source data at predetermined positions, in order to transmit the coded source data at a specific data rate. The number of inserting bits and the positions where the inserting bits are inserted are previously scheduled with receiving devices. A first channel coder 903 codes the data outputted from the first bit inserter 902 at a specific coding rate and outputs user symbols (including data symbols and parity symbols). A turbo coder or a convolutional coder can be used for the first channel coder 903. A first rate matcher 904 matches a rate of symbol data outputted from the first channel coder 903 to a symbol rate of the transmission channel. The first rate matcher 904 can be composed of a repeater for repeating input data and a puncturer for puncturing the repeated symbol data. Also, the first rate matcher 904 can be composed of any one of the repeater and the puncturer.

More specifically, when a coded user symbol rate is higher than a given channel user symbol rate, the first rate matcher 904 can be implemented by a puncturer for puncturing the user symbols. However, when the coded user symbol rate is lower than the given channel user symbol rate, the first rate matcher 904 can be implemented by a repeater for repeating the user symbols to match the user symbol rate to the given channel user symbol rate. Alternatively, when the coded user symbol rate is lower than the given channel user symbol rate, the first rate matcher 904 can be implemented by a repeater for repeating the user symbols to approximately match the user symbol rate to the given channel user symbol rate and a puncturer for matching a rate of the repeated user symbols to the given channel user symbol rate.

Furthermore, a second source coder 911 codes input source control data according to a predetermined coding method. A second bit inserter 912 inserts a predetermined number of bits in the coded source data, in order to transmit the coded source data at a specific data rate. The number of inserting bits and the positions where the inserting bits are inserted are previously scheduled with receiving devices. A second channel coder 913 codes the data outputted from the second bit inserter 912 at a specific coding rate and outputs data symbols and parity symbols. A turbo coder or a convolutional coder can be used for the second channel coder 913. A second rate matcher 914 matches a rate of symbol data outputted from the second channel coder 913 to a symbol rate of the transmission channel. The second rate matcher 914 can be composed of a repeater for repeating input data and a puncturer for puncturing the repeated symbol data. Also, the second rate matcher 914 can be composed of any one of the repeater and the puncturer.

More specifically, when a coded control symbol rate is higher than a given channel control symbol rate, the second rate matcher 914 can be implemented by a puncturer for puncturing the control symbols. However, when the coded control symbol rate is lower than the given channel control symbol rate, the second rate matcher 914 can be implemented by a repeater for repeating the control symbols to match the control symbol rate to the given channel control symbol rate. Alternatively, when the coded control symbol rate is lower than the given channel control symbol rate, the second rate matcher 914 can be implemented by a repeater for repeating the control symbols to approximately match the control symbol rate to the given channel control symbol rate and a puncturer for matching a rate of the repeated control symbols to the given channel control symbol rate.

A multiplexer 905 multiplexes the rate matched user data symbols and control data symbols, and a channel interleaver 906 interleaves the rate matched symbol data. A modulator 907 modulates the channel interleaved symbol data. The modulator 907 may employ CDMA modulation techniques. A transmitter 908 converts the modulated transmission data to an RF signal and transmits the converted RF signal.

Figure 10:
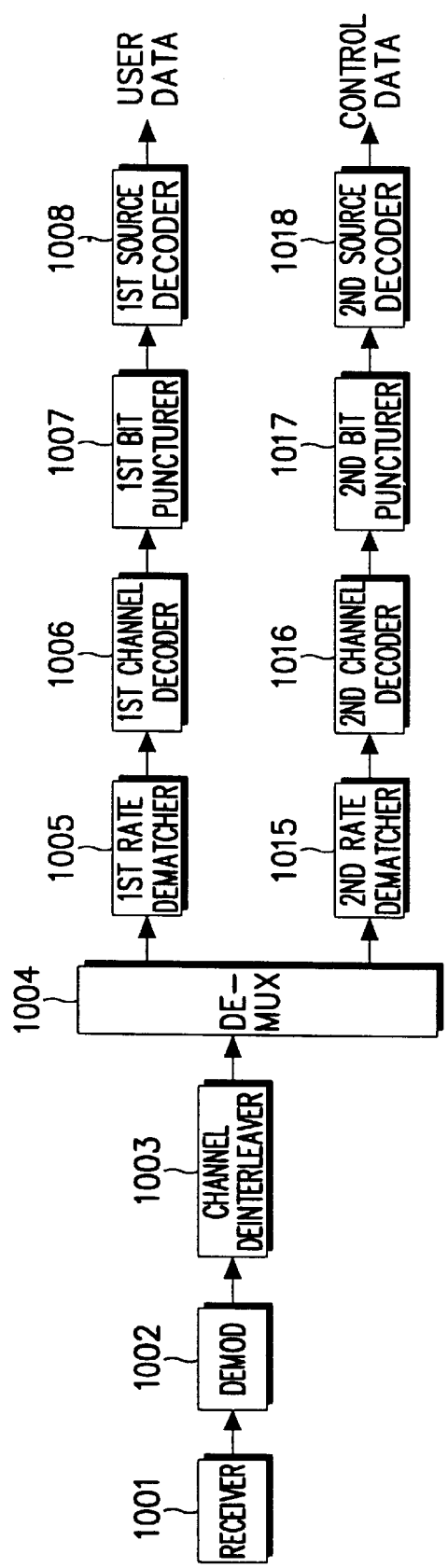
FIG. 10 is a block diagram illustrating a reception part corresponding to the transmission part of FIG. 9.

FIG. 10 is a block diagram illustrating a reception part for a communication system having the channel coder of FIG. 9. A signal received via a transmission channel (or receiver) 1001 is demodulated by a demodulator 1002, and demultiplexed by a demultiplexer 1004 into user data and control data after channel deinterleaving at a channel deinterleaver 1003. The demultiplexed user data experiences symbol combination or insertion at a first rate dematcher 1005, and a first channel decoder 1006 decodes the rate dematched user data. Since the decoded data includes the bits inserted by the first bit inserter 902 of FIG. 9, a first bit puncturer 1007 deletes (or punctures) the data bits as many as the number of the bits inserted by the first bit inserter 902 of the transmission party. A first source decoder 1008 decodes the bit-punctured data to output the user data.

Further, the demultiplexed control data experiences symbol combination or insertion at a second rate dematcher 1015, and a second channel decoder 1016 decodes the rate dematched control data. Since the decoded data includes the bits inserted by the second bit inserter 912 of FIG. 9, a second bit puncturer 1017 punctures the data bits as many as the number of the bits inserted by the second bit inserter 912 of the transmission party. A second source decoder 1018 decodes the bit-punctured data to output the control data. For the channel decoders 1006 and 1016 of FIG. 10, a Viterbi decoder can be used when a convolutional code is used and a soft-decision iterative decoder can be used when a turbo code is used.

C. Third Embodiment

Figure 11:
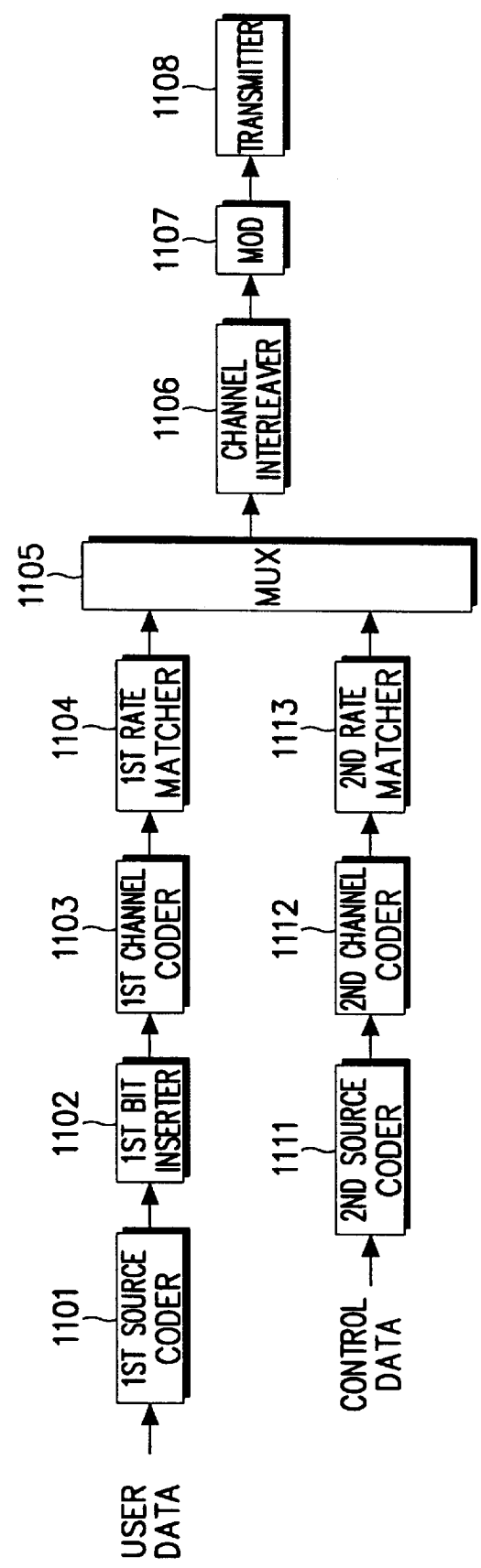
FIG. 11 is a block diagram illustrating a transmission part of a communication system according to a third embodiment of the present invention.

FIG. 11 is a block diagram illustrating a rate matching scheme for a channel coding device according to a third embodiment of the present invention. The channel coding device inserts known bits at predetermined positions, for rate matching for user data, and does not insert the know bits, for rate matching for control data. A first source coder 1101 codes input source user data according to a predetermined coding method. A first bit inserter 1102 inserts a predetermined number of known bits in the coded source data at predetermined positions, in order to transmit the coded source data at a specific data rate. The number of the inserting bits and the positions where inserting bits are inserted are previously scheduled with receiving devices. A first channel coder 1103 codes the data outputted from the first bit inserter 1102 at a specific coding rate and outputs user symbols (including data symbols and parity symbols). A turbo coder or a convolutional coder can be used for the first channel coder 1103. A first rate matcher 1104 matches a rate of symbol data outputted from the first channel coder 1103 to a symbol rate of the transmission channel. The first rate matcher 1104 can be composed of a repeater for repeating input data and a puncturer for puncturing the repeated symbol data. Also, the first rate matcher 1104 can be composed of any one of the repeater and the puncturer.

More specifically, when a coded user symbol rate is higher than a given channel user symbol rate, the first rate matcher 1104 can be implemented by a puncturer for puncturing the user symbols. However, when the coded user symbol rate is lower than the given channel user symbol rate, the first rate matcher 1104 can be implemented by a repeater for repeating the user symbols to match the user symbol rate to the given channel user symbol rate. Alternatively, when the coded user symbol rate is lower than the given channel user symbol rate, the first rate matcher 1104 can be implemented by a repeater for repeating the user symbols to approximately match the user symbol rate to the given channel user symbol rate and a puncturer for matching a rate of the repeated user symbols to the given channel user symbol rate.

Furthermore, a second source coder 1111 codes input source control data according to a predetermined coding method. A second channel coder 1112 codes the data outputted from the second source coder 1111 at a specific coding rate and outputs data symbols and parity symbols. A turbo coder or a convolutional coder can be used for the second channel coder 1112. A second rate matcher 1113 matches a rate of symbol data outputted from the second channel coder 1112 to a symbol rate of the transmission channel. The second rate matcher 1113 can be composed of a repeater for repeating input data and a puncturer for puncturing the repeated symbol data. Also, the second rate matcher 1113 can be composed of any one of the repeater and the puncturer.

More specifically, when a coded control symbol rate is higher than a given channel control symbol rate, the second rate matcher 1113 can be implemented by a puncturer for puncturing the control symbols. However, when the coded control symbol rate is lower than the given channel control symbol rate, the second rate matcher 1113 can be implemented by a repeater for repeating the control symbols to match the control symbol rate to the given channel control symbol rate. Alternatively, when the coded control symbol rate is lower than the given channel control symbol rate, the second rate matcher 1113 can be implemented by a repeater for repeating the control symbols to approximately match the control symbol rate to the given channel control symbol rate and a puncturer for matching a rate of the repeated control symbols to the given channel control symbol rate.

A multiplexer 1105 multiplexes the rate matched user data symbols and control data symbols, and a channel interleaver 1106 interleaves the rate matched symbol data. A modulator 1107 modulates the channel interleaved symbol data. The modulator 1107 may employ CDMA modulation techniques. A transmitter 1108 converts the modulated transmission data to an RF signal and transmits the converted RF signal.

Figure 12:
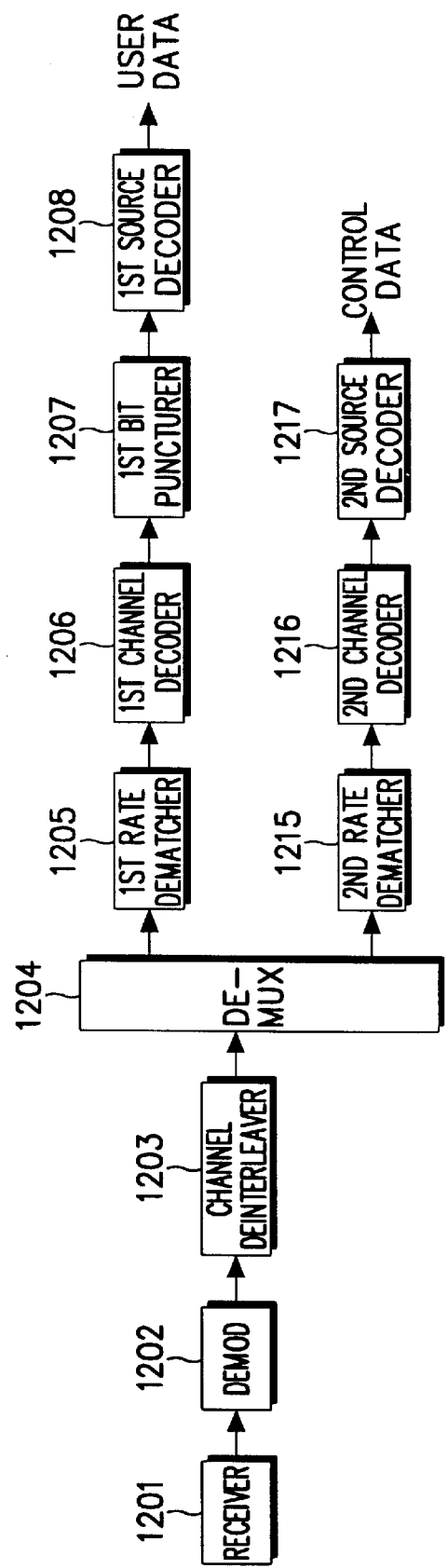
FIG. 12 is a block diagram illustrating a reception part corresponding to the transmission part of FIG. 11.

FIG. 12 is a block diagram illustrating a reception part for a communication system having the channel coder of FIG. 11. Referring to FIG. 12, a signal received via a transmission channel (or receiver) 1201 is demodulated by a demodulator 1202, and demultiplexed by a demultiplexer 1204 into user data and control data after channel deinterleaving at a channel deinterleaver 1203. The demultiplexed user data experiences symbol combination or insertion at a first rate dematcher 1205, and a first channel decoder 1206 decodes the rate dematched user data. Since the decoded data includes the bits inserted by the first bit inserter 1102 of FIG. 11, a first bit puncturer 1207 punctures the data bits as many as the number of the bits inserted by the first bit inserter 1102 of the transmission party. A first source decoder 1208 decodes the bit-punctured data to output the user data.

Moreover, the demultiplexed control data experiences symbol combination or insertion at a second rate dematcher 1215, and a second channel decoder 1216 decodes the rate dematched control data. A second source decoder 1217 decodes the decoded data to output the control data. For the channel decoders 1206 and 1216 of FIG. 12, a Viterbi decoder can be used when a convolutional code is used and a soft-decision iterative decoder can be used when a turbo code is used.

D. Fourth Embodiment

Figure 13:
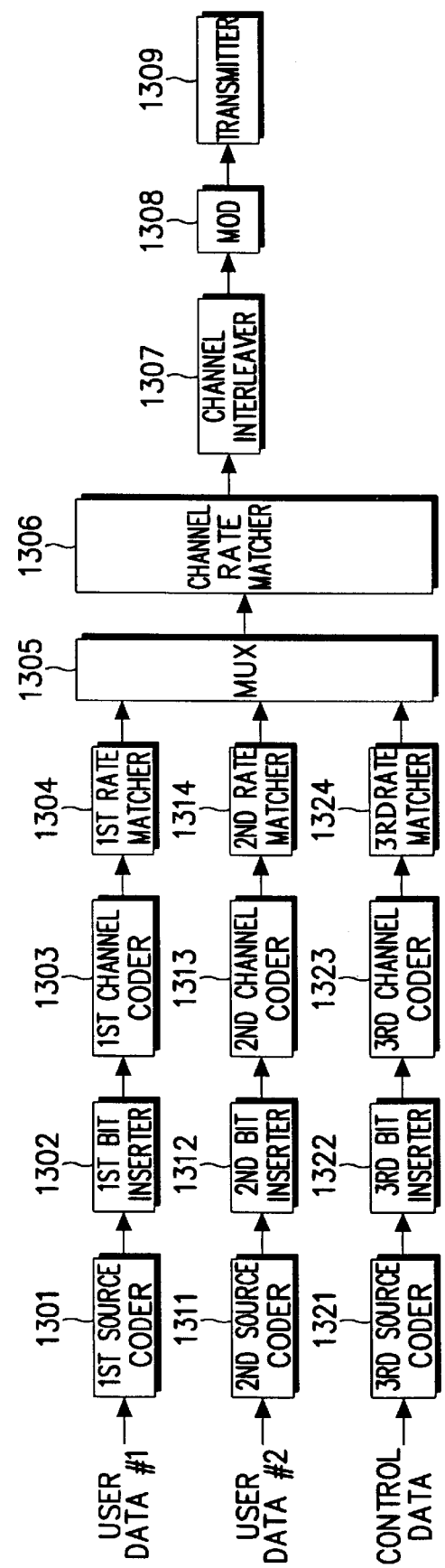
FIG. 13 is a block diagram illustrating a transmission part of a communication system according to a fourth embodiment of the present invention.

FIG. 13 is a block diagram illustrating a rate matching scheme for a channel coding device according to a fourth embodiment of the present invention. The channel coding device inserts known bits at predetermined positions, for rate matching for first and second user data and control data. Although a description will be made with reference to an embodiment supporting two sets of user data, the number of the user data sets can be expanded.

A first source coder 1301 codes first input user data according to a predetermined coding method. A first bit inserter 1302 inserts a predetermined number of known bits in the coded source data at predetermined positions, in order to transmit the coded source data at a specific data rate. The number of inserting bits and the positions where the inserting bits are inserted are previously scheduled with receiving devices. A first channel coder 1303 codes the data outputted from the first bit inserter 1302 at a specific coding rate to output user symbols (including data symbols and parity symbols). A turbo coder or a convolutional coder can be used for the first channel coder 1303. A first rate matcher 1304 matches a rate of symbol data outputted from the first channel coder 1303 to a symbol rate of the transmission channel. The first rate matcher 1304 can be composed of a repeater for repeating input data and a puncturer for puncturing the repeated symbol data. Also, the first rate matcher 1304 can be composed of any one of the repeater and the puncturer.

More specifically, when a coded user symbol rate is higher than a given channel user symbol rate, the first rate matcher 1304 can be implemented by a puncturer for puncturing the user symbols. However, when the coded user symbol rate is lower than the given channel user symbol rate, the first rate matcher 1304 can be implemented by a repeater for repeating the user symbols to match the user symbol rate to the given channel user symbol rate. Alternatively, when the coded user symbol rate is lower than the given channel user symbol rate, the first rate matcher 1304 can be implemented by a repeater for repeating the user symbols to approximately match the user symbol rate to the given channel user symbol rate and a puncturer for matching a rate of the repeated user symbols to the given channel user symbol rate.

Further, a second source coder 1311 codes second input user data according to a predetermined coding method. A second bit inserter 1312 inserts a predetermined number of known bits in the coded source data at predetermined positions, in order to transmit the coded source data at a specific data rate. The number of inserting bits and the positions where the inserting bits are inserted are previously scheduled with receiving devices. A second channel coder 1313 codes the data outputted from the second bit inserter 1312 at a specific coding rate to output user symbols (including data symbols and parity symbols). A turbo coder or a convolutional coder can be used for the second channel coder 1313. A second rate matcher 1314 matches a rate of symbol data outputted from the second channel coder 1313 to a symbol rate of the transmission channel. The second rate matcher 1314 can be composed of a repeater for repeating input data and a puncturer for puncturing the repeated symbol data. Also, the second rate matcher 1314 can be composed of any one of the repeater and the puncturer.

More specifically, when a coded user symbol rate is higher than a given channel user symbol rate, the second rate matcher 1314 can be implemented by a puncturer for puncturing the user symbols. However, when the coded user symbol rate is lower than the given channel user symbol rate, the second rate matcher 1314 can be implemented by a repeater for repeating the user symbols to match the user symbol rate to the given channel user symbol rate. Alternatively, when the coded user symbol rate is lower than the given channel user symbol rate, the second rate matcher 1314 can be implemented by a repeater for repeating the user symbols to approximately match the user symbol rate to the given channel user symbol rate and a puncturer for matching a rate of the repeated user symbols to the given channel user symbol rate.

Moreover, a third source coder 1321 codes input source control data according to a predetermined coding method. A third bit inserter 1322 inserts a predetermined number of known bits in the coded source data at predetermined positions, in order to transmit the coded source data at a specific data rate. The number of inserting bits and the positions where the inserting bits are inserted are previously scheduled with receiving devices. A third channel coder 1323 codes the data outputted from the third bit inserter 1322 at a specific coding rate to output control symbols (including data symbols and parity symbols). A turbo coder or a convolutional coder can be used for the third channel coder 1323. A third rate matcher 1324 matches a rate of symbol data outputted from the third channel coder 1323 to a symbol rate of the transmission channel. The third rate matcher 1324 can be composed of a repeater for repeating input data and a puncturer for puncturing the repeated symbol data. Also, the third rate matcher 1324 can be composed of any one of the repeater and the puncturer.

More specifically, when a coded control symbol rate is higher than a given channel control symbol rate, the third rate matcher 1324 can be implemented by a puncturer for puncturing the control symbols. However, when the coded control symbol rate is lower than the given channel control symbol rate, the third rate matcher 1324 can be implemented by a repeater for repeating the control symbols to match the control symbol rate to the given channel control symbol rate. Alternatively, when the coded control symbol rate is lower than the given channel control symbol rate, the third rate matcher 1324 can be implemented by a repeater for repeating the control symbols to approximately match the control symbol rate to the given channel control symbol rate and a puncturer for matching a rate of the repeated control symbols to the given channel control symbol rate.

It is contemplated that the number of bits inserted at the first through third bit inserters 1302, 1312 and 1322 can be varied according to the service options and classes of the first user data, the second user data and the control data.

A multiplexer 1305 multiplexes the rate matched user data symbols and control data symbols. A rate of the multiplexed data is matched to a channel symbol rate at a channel rate matcher 1306, and the rate matched symbol data is interleaved by a channel interleaver 1307. A modulator 1308 modulates the channel interleaved symbol data. The modulator 1308 may employ CDMA modulation techniques. A transmitter 1309 converts the modulated transmission data to an RF signal and transmits the converted RF signal.

In this embodiment, when a rate of the symbols outputted from the multiplexer 1305 is higher than a given channel symbol rate, the channel rate matcher 1306 can be implemented by a puncturer for puncturing the symbols. However, when the rate of the symbols outputted from the multiplexer 1305 is lower than the given channel control symbol rate, the channel rate matcher 1306 can be implemented by a repeater for repeating the symbols to match the symbol rate to the given channel symbol rate. Alternatively, when the rate of the symbols outputted from the multiplexer 1305 is lower than the given channel symbol rate, the channel rate matcher 1306 can be implemented by a repeater for repeating the symbols to approximately match the symbol rate to the given channel symbol rate and a puncturer for matching a rate of the repeated symbols to the given channel symbol rate.

Figure 14:
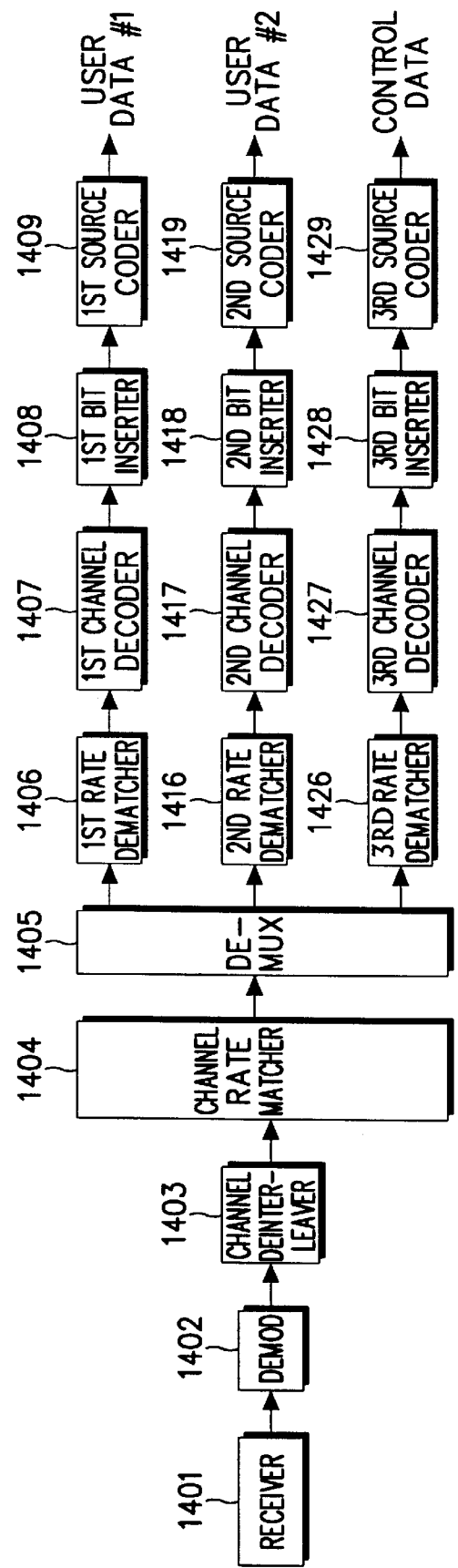
FIG. 14 is a block diagram illustrating a reception part corresponding to the transmission part of FIG. 13.

FIG. 14 is a block diagram illustrating a reception part for a communication system having the channel coder of FIG. 13. A signal received via a transmission channel (or receiver) 1401 is demodulated by a demodulator 1402. The demodulated data experiences symbol combination or insertion at a channel rate dematcher 1404 after channel deinterleaving at a channel deinterleaver 1403, and the rate matched data is demultiplexed into first and second user data and control data by a demultiplexer 1405. The first demultiplexed user data experiences symbol combination or insertion at a first rate dematcher 1406, and a first channel decoder 1407 decodes the rate dematched user data. Since the decoded data includes the bits inserted by the first bit inserter 1302 of FIG. 13, a first bit puncturer 1408 punctures the data bits as many as the number of the bits inserted by the first bit inserter 1302 of the transmission party. A first source decoder 1409 decodes the bit-punctured data to output the first user data.

Furthermore, the second demultiplexed user data experiences symbol combination or insertion at a second rate dematcher 1416, and a second channel decoder 1417 decodes the rate dematched user data. Since the decoded data includes the bits inserted by the second bit inserter 1312 of FIG. 13, a second bit puncturer 1418 punctures the data bits as many as the number of the bits inserted by the second bit inserter 1312 of the transmission party. A second source decoder 1419 decodes the bit-punctured data to output the second user data.

Moreover, the demultiplexed control data experiences symbol combination or insertion at a third rate dematcher 1426, and a third channel decoder 1427 decodes the rate dematched control data. Since the decoded data includes the bits inserted by the third bit inserter 1322 of FIG. 13, a third bit puncturer 1428 punctures the data bits as many as the number of the bits inserted by the third bit inserter 1322 of the transmission party. A third source decoder 1429 decodes the bit-punctured data to output the control data.

For the channel decoders 1407, 1417 and 1427 of FIG. 14, a Viterbi decoder can be used when a convolutional code is used and a soft-decision iterative decoder can be used when a turbo code is used.

E. Fifth Embodiment

Figure 15:
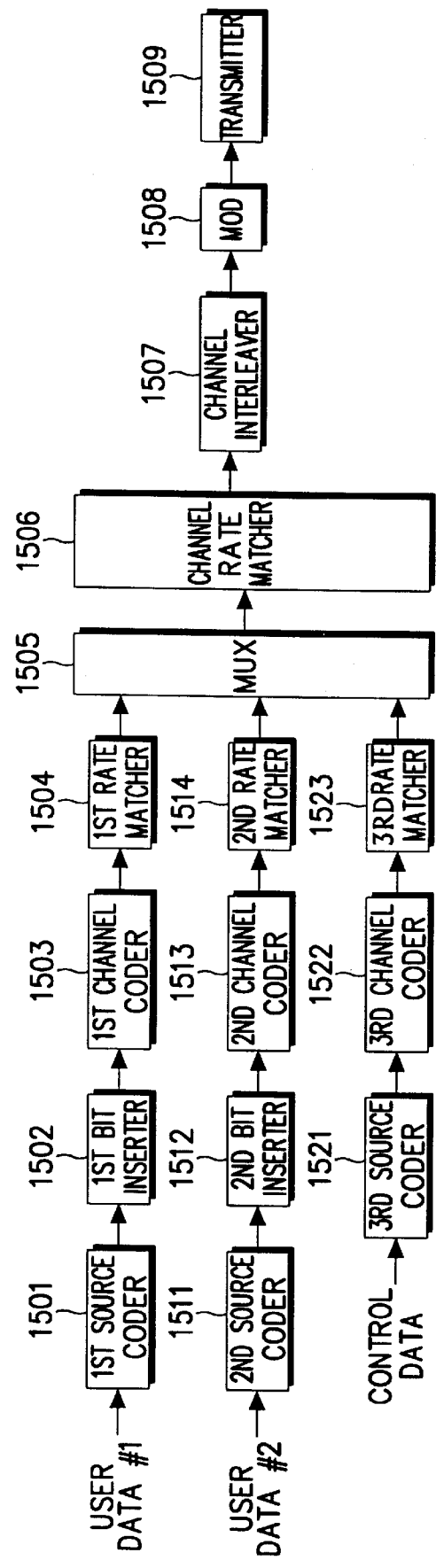
FIG. 15 is a block diagram illustrating a transmission part of a communication system according to a fifth embodiment of the present invention.

FIG. 15 is a block diagram illustrating a rate matching scheme for a channel coding device according to a fifth embodiment of the present invention. The channel coding device inserts known bits at predetermined positions, for rate matching for first and second user data and control data. Although a description will be made with reference to an embodiment supporting two sets of user data, the number of the user data sets can be expanded.

A first source coder 1501 codes first input user data according to a predetermined coding method. A first bit inserter 1502 inserts a predetermined number of known bits in the coded source data at predetermined positions, in order to transmit the coded source data at a specific data rate. The number of inserting bits and the positions where the inserting bits are inserted are previously scheduled with receiving devices. A first channel coder 1503 codes the data outputted from the first bit inserter 1502 at a specific coding rate to output user symbols (including data symbols and parity symbols). A turbo coder or a convolutional coder can be used for the first channel coder 1503. A first rate matcher 1504 matches a rate of symbol data outputted from the first channel coder 1503 to a symbol rate of the transmission channel. The first rate matcher 1504 can be composed of a repeater for repeating input data and a puncturer for puncturing the repeated symbol data. Also, the first rate matcher 1504 can be composed of any one of the repeater and the puncturer.

More specifically, when a coded user symbol rate is higher than a given channel user symbol rate, the first rate matcher 1504 can be implemented by a puncturer for puncturing the user symbols. However, when the coded user symbol rate is lower than the given channel user symbol rate, the first rate matcher 1504 can be implemented by a repeater for repeating the user symbols to match the user symbol rate to the given channel user symbol rate. Alternatively, when the coded user symbol rate is lower than the given channel user symbol rate, the first rate matcher 1504 can be implemented by a repeater for repeating the user symbols to approximately match the user symbol rate to the given channel user symbol rate and a puncturer for matching a rate of the repeated user symbols to the given channel user symbol rate.

Further, a second source coder 1511 codes second input user data according to a predetermined coding method. A second bit inserter 1512 inserts a predetermined number of known bits in the coded source data at predetermined positions, in order to transmit the coded source data at a specific data rate. The number of inserting bits and the positions where the inserting bits are inserted are previously scheduled with receiving devices. A second channel coder 1513 codes the data outputted from the second bit inserter 1512 at a specific coding rate to output user symbols (including data symbols and parity symbols). A turbo coder or a convolutional coder can be used for the second channel coder 1513. A second rate matcher 1514 matches a rate of symbol data outputted from the second channel coder 1513 to a symbol rate of the transmission channel. The second rate matcher 1514 can be composed of a repeater for repeating input data and a puncturer for puncturing the repeated symbol data. Also, the second rate matcher 1514 can be composed of any one of the repeater and the puncturer.

More specifically, when a coded user symbol rate is higher than a given channel user symbol rate, the second rate matcher 1514 can be implemented by a puncturer for puncturing the user symbols. However, when the coded user symbol rate is lower than the given channel user symbol rate, the second rate matcher 1514 can be implemented by a repeater for repeating the user symbols to match the user symbol rate to the given channel user symbol rate. Alternatively, when the coded user symbol rate is lower than the given channel user symbol rate, the second rate matcher 1514 can be implemented by a repeater for repeating the user symbols to approximately match the user symbol rate to the given channel user symbol rate and a puncturer for matching a rate of the repeated user symbols to the given channel user symbol rate.

Moreover, a third source coder 1521 codes input source control data according to a predetermined coding method. A third channel coder 1522 codes the data outputted from the third source coder 1521 at a specific coding rate to output data symbols and parity symbols. A turbo coder or a convolutional coder can be used for the third channel coder 1522. A third rate matcher 1523 matches a rate of symbol data outputted from the third channel coder 1522 to a symbol rate of the transmission channel. The third rate matcher 1523 can be composed of a repeater for repeating input data and a puncturer for puncturing the repeated symbol data. Also, the third rate matcher 1523 can be composed of any one of the repeater and the puncturer.

More specifically, when a coded control symbol rate is higher than a given channel control symbol rate, the third rate matcher 1523 can be implemented by a puncturer for puncturing the control symbols. However, when the coded control symbol rate is lower than the given channel control symbol rate, the third rate matcher 1523 can be implemented by a repeater for repeating the control symbols to match the control symbol rate to the given channel control symbol rate. Alternatively, when the coded control symbol rate is lower than the given channel control symbol rate, the third rate matcher 1523 can be implemented by a repeater for repeating the control symbols to approximately match the control symbol rate to the given channel control symbol rate and a puncturer for matching a rate of the repeated control symbols to the given channel control symbol rate.

A multiplexer 1505 multiplexes the rate matched user data symbols and control data symbols. A rate of the multiplexed data is matched to a channel symbol rate at a channel rate matcher 1506, and the rate matched symbol data is interleaved by a channel interleaver 1507. A modulator 1508 modulates the channel interleaved symbol data. The modulator 1508 may employ CDMA modulation techniques. A transmitter 1509 converts the modulated transmission data to an RF signal and transmits the converted RF signal.

In this embodiment, when a rate of the symbols outputted from the multiplexer 1505 is higher than a given channel symbol rate, the channel rate matcher 1506 can be implemented by a puncturer for puncturing the symbols. However, when the rate of the symbols outputted from the multiplexer 1505 is lower than the given channel control symbol rate, the channel rate matcher 1506 can be implemented by a repeater for repeating the symbols to match the symbol rate to the given channel symbol rate. Alternatively, when the rate of the symbols outputted from the multiplexer 1505 is lower than the given channel symbol rate, the channel rate matcher 1506 can be implemented by a repeater for repeating the symbols to approximately match the symbol rate to the given channel symbol rate and a puncturer for matching a rate of the repeated symbols to the given channel symbol rate.

Figure 16:
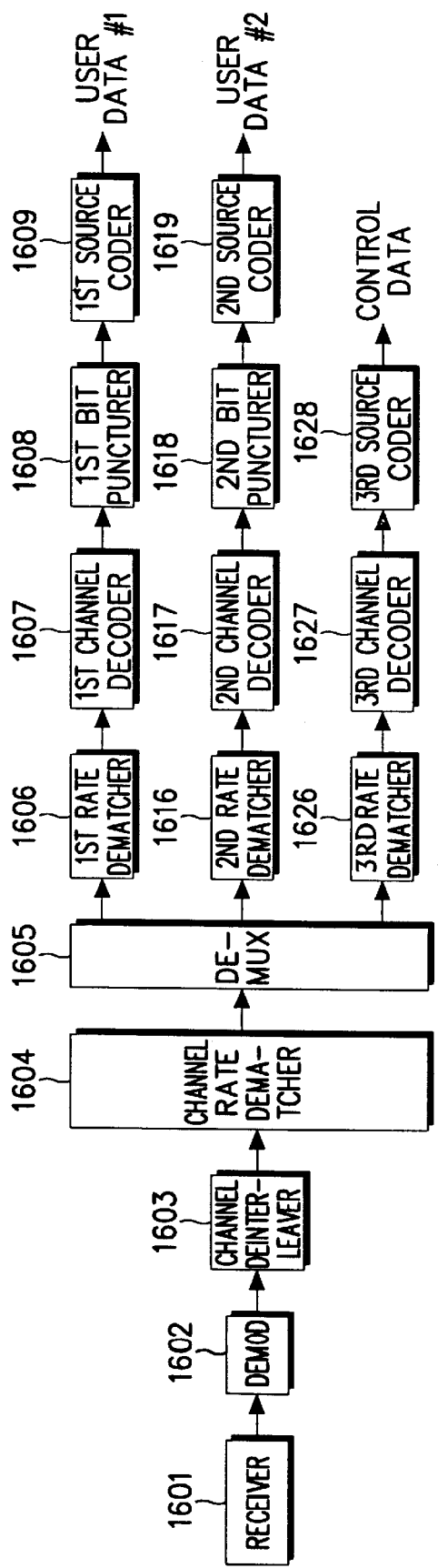
FIG. 16 is a block diagram illustrating a reception part corresponding to the transmission part of FIG. 15.

FIG. 16 is a block diagram illustrating a reception part for a communication system having the channel coder of FIG. 15. Referring to FIG. 16, a signal received via a transmission channel (or receiver) 1601 is demodulated by a demodulator 1602. The demodulated data experiences symbol combination or insertion at a channel rate dematcher 1604 after channel deinterleaving at a channel deinterleaver 1603, and the rate matched data is demultiplexed into first and second user data and control data by a demultiplexer 1605. The first demultiplexed user data experiences symbol combination or insertion at a first rate dematcher 1606, and a first channel decoder 1607 decodes the rate dematched user data. Since the decoded data includes the bits inserted by the first bit inserter 1502 of FIG. 15, a first bit puncturer 1608 punctures the data bits as many as the number of the bits inserted by the first bit inserter 1502 of the transmission party. A first source decoder 1609 decodes the bit-punctured data to output the first user data.

Furthermore, the second demultiplexed user data experiences symbol combination or insertion at a second rate dematcher 1616, and a second channel decoder 1617 decodes the rate dematched user data. Since the decoded data includes the bits inserted by the second bit inserter 1512 of FIG. 15, a second bit puncturer 1618 punctures the data bits as many as the number of the bits inserted by the second bit inserter 1512 of the transmission party. A second source decoder 1619 decodes the bit-punctured data to output the second user data.

Moreover, the demultiplexed control data experiences symbol combination or insertion at a third rate dematcher 1626, and a third channel decoder 1627 decodes the rate dematched control data. A third source decoder 1628 decodes the decoded data outputted from the third channel decoder 1627 to output the control data. For the channel decoders 1607, 1617 and 1627 of FIG. 16, a Viterbi decoder can be used when a convolutional code is used and a soft-decision iterative decoder can be used when a turbo code is used.

The transmission schemes of FIGS. 9, 11, 13 and 15 include independent rate matchers for the user data and the control data. However, in FIG. 9, for example, there is a case where only the first rate matcher 904 performs symbol puncturing while the second rate matcher 914 does not perform symbol puncturing. In this case, in the reception part of FIG. 10, only the first rate dematcher 1005 operates while the second rate dematcher 1015 does not operate. On the contrary, in FIG. 9, there is a case where only the second rate matcher 914 performs symbol puncturing while the first rate matcher 904 does not perform symbol puncturing. In this case, in the reception part of FIG. 10, only the second rate dematcher 1015 operates while the first rate dematcher 1005 does not operate. Similarly, even in FIGS. 11, 13 and 15, it is contemplated that there may be cases where not all of the rate matchers perform rate matching simultaneously.

As described above, in accordance with the present invention, it is possible to minimize performance degradation of a mobile communication system during symbol repetition, puncturing and puncturing-after-symbol repetition in a rate matching device for facilitating implementation of hardware. Furthermore, since the reception party previously knows the inserted bits in the novel rate matching device, performance of the overall communication system increases as compared with a simple symbol repetition or puncturing-after-symbol repetition method where the reception party does not know the inserted bits.

In addition, with the present invention, it is possible to minimize performance degradation by puncturing the parity bits, not the data bits, when puncturing the coded symbols outputted from an RSC channel coder. Also, it is possible to minimize performance degradation by performing selective puncturing, such that the parity bits simultaneously generated by the respective constituent coders are not all punctured.

While the invention has been shown and described with reference to a certain preferred embodiments thereof, it will be understood by those skilled in the art that various changes in form and details may be made therein without departing from the spirit and scope of the invention as defined by the appended claims.

What is claimed is:

1. A channel coding device comprising:
   a bit inserter for inserting known bits in an input data bit stream at predetermined positions;
   a channel coder for coding the bit-inserted data bit stream to generate coded symbols;
   a rate matcher for matching a rate of the coded symbols to a given channel symbol rate; and
   a channel interleaver for interleaving the rate matched channel symbols.

2. The channel coding device as claimed in claim 1, wherein the rate matcher comprises a puncturer for puncturing the inserted known bits included in the coded symbols when the coded symbol rate is higher than the given channel symbol rate.

3. The channel coding device as claimed in claim 2, wherein the puncturer punctures only parity symbols.

4. The channel coding device as claimed in claim 3, wherein the puncturer punctures only specific parity symbols outputted by the channel coder.

5. The channel coding device as claimed in claim 4, wherein the puncturer punctures only specific parity symbols such that the parity symbols are not consecutively punctured as many as the number of memories in a constituent coder for the channel coder.

6. The channel coding device as claimed in claim 4, wherein the puncturer selectively punctures only specific parity symbols such that not all of the parity symbols for a data bit are punctured.

7. The channel coding device as claimed in claim 1, wherein the rate matcher comprises a repeater for repeating the coded symbols to match the coded symbol rate to the given channel symbol rate when the coded symbol rate is lower than the given channel symbol rate.

8. The channel coding device as claimed in claim 1, wherein the rate matcher comprises:
   a repeater for repeating the coded symbols to approximately match the coded symbol rate to the given channel symbol rate when the coded symbol rate is lower than the given channel symbol rate; and
   a puncturer for puncturing the repeated symbols to match a rate of the repeated symbols to the given channel symbol rate.

9. The channel coding device as claimed in claim 8, wherein the puncturer punctures only parity symbols.

10. The channel coding device as claimed in claim 9, wherein the puncturer punctures only specific parity symbols outputted by the channel coder.

11. The channel coding device as claimed in claim 10, wherein the puncturer punctures only specific parity symbols such that the parity symbols are not consecutively punctured as many as the number of memories in a constituent coder for the channel coder.

12. The channel coding device as claimed in claim 10, wherein the puncturer selectively punctures only specific parity symbols such that not all of the parity symbols for a data bit are punctured.

13. A channel coding device comprising:
   first bit inserters for inserting known bits in corresponding source user data bit streams at predetermined positions;
   first channel coders for coding the bit-inserted user data bit streams to generate coded user symbols;
   first rate matchers for matching a rate of the user symbols to a given channel user symbol rate;
   a second bit inserter for inserting known bits in a source control data bit stream at predetermined positions;
   a second channel coder for coding the bit-inserted control data bit stream to generate coded control symbols;
   a second rate matcher for matching a rate of the control symbols to a given channel control symbol rate;
   a multiplexer for multiplexing an output of the first rate matcher and an output of the second rate matcher;
   a channel rate matcher for matching a rate of symbols outputted from the multiplexer to a given channel control symbol rate; and a channel interleaver for interleaving output symbols of the channel rate matcher in a channel unit.

14. The channel coding device as claimed in claim 13, wherein the first rate matchers each comprise a puncturer for puncturing the user symbols when the user symbol rate is higher than the given channel user symbol rate.

15. The channel coding device as claimed in claim 13, wherein the first rate matchers each comprise a repeater for repeating the user symbols to match the user symbol rate to the given channel user symbol rate when the user symbol rate is lower than the given channel user symbol rate.

16. The channel coding device as claimed in claim 13, wherein the first rate matchers each comprise:
   a repeater for repeating the user symbols to approximately match the user symbol rate to the given channel user symbol rate when the user symbol rate is lower than the given channel user symbol rate; and
   a puncturer for puncturing the repeated user symbols to match a rate of the repeated user symbols to the given channel user symbol rate.

17. The channel coding device as claimed in claim 13, wherein the second rate matcher comprises a puncturer for puncturing the control symbols when the control symbol rate is higher than the given channel control symbol rate.

18. The channel coding device as claimed in claim 13, wherein the second rate matcher comprises a repeater for repeating the control symbols to match the control symbol rate to the given channel control symbol rate when the control symbol rate is lower than the given channel control symbol rate.

19. The channel coding device as claimed in claim 13, wherein the second rate matcher comprises:
   a repeater for repeating the control symbols to approximately match the control symbol rate to the given channel control symbol rate when the control symbol rate is lower than the given channel control symbol rate; and
   a puncturer for puncturing the repeated control symbols to match a rate of the repeated control symbols to the given channel control symbol rate.

20. The channel coding device as claimed in claim 13, wherein the channel rate matcher comprises a puncturer for puncturing symbols outputted from the multiplexer when a rate of the symbols outputted from the multiplexer is higher than the given channel symbol rate.

21. The channel coding device as claimed in claim 13, wherein the channel rate matcher comprises a repeater for repeating the symbols outputted from the multiplexer to match a symbol rate to the given channel symbol rate when the rate of the symbols outputted from the multiplexer is lower than the given channel symbol rate.

22. The channel coding device as claimed in claim 13, wherein the channel rate matcher comprises:
   a repeater for repeating the symbols outputted from the multiplexer to approximately match a symbol rate to the given channel symbol rate when the rate of the symbols outputted from the multiplexer is lower than the given channel symbol rate; and
   a puncturer for puncturing the repeated symbols to match a repeated symbol rate to the given channel symbol rate.

23. A channel coding device comprising:
   first bit inserters for inserting known bits in corresponding source user data bit streams at predetermined positions;
   first channel coders for coding the bit-inserted user data bit streams to generate coded user symbols;
   first rate matchers for matching a rate of the user symbols to a given channel user symbol rate;
   a second channel coder for coding a source control data bit stream to generate coded control symbols;
   a second rate matcher for matching a rate of the control symbols to a given channel control symbol rate;
   a multiplexer for multiplexing an output of the first rate matcher and an output of the second rate matcher;
   a channel rate matcher for matching a rate of symbols outputted from the multiplexer to a given channel symbol rate; and
   a channel interleaver for interleaving output symbols of the channel rate matcher in a channel unit.

24. The channel coding device as claimed in claim 23, wherein the first rate matchers each comprise a puncturer for puncturing the user symbols when the user symbol rate is higher than the given channel user symbol rate.

25. The channel coding device as claimed in claim 23, wherein the first rate matchers each comprise a repeater for repeating the user symbols to match the user symbol rate to the given channel user symbol rate when the user symbol rate is lower than the given channel user symbol rate.

26. The channel coding device as claimed in claim 23, wherein the first rate matchers each comprise:
   a repeater for repeating the user symbols to approximately match the user symbol rate to the given channel user symbol rate when the user symbol rate is lower than the given channel user symbol rate; and
   a puncturer for puncturing the repeated user symbols to match a repeated user symbol rate to the given channel user symbol rate.

27. The channel coding device as claimed in claim 23, wherein the second rate matcher comprises a puncturer for puncturing the control symbols when the control symbol rate is higher than the given channel control symbol rate.

28. The channel coding device as claimed in claim 23, wherein the second rate matcher comprises a repeater for repeating the control symbols to match the control symbol rate to the given channel control symbol rate when the control symbol rate is lower than the given channel control symbol rate.

29. The channel coding device as claimed in claim 23, wherein the second rate matcher comprises:
   a repeater for repeating the control symbols to approximately match the control symbol rate to the given channel control symbol rate when the control symbol rate is lower than the given channel control symbol rate; and
   a puncturer for puncturing the repeated control symbols to match a repeated control symbol rate to the given channel control symbol rate.

30. The channel coding device as claimed in claim 23, wherein the channel rate matcher comprises a puncturer for puncturing symbols outputted from the multiplexer when a rate of the symbols outputted from the multiplexer is higher than the given channel symbol rate.

31. The channel coding device as claimed in claim 23, wherein the channel rate matcher comprises a repeater for repeating the symbols outputted from the multiplexer to match the symbol rate to the given channel symbol rate when a rate of the symbols outputted from the multiplexer is lower than the given channel symbol rate.

32. The channel coding device as claimed in claim 23, wherein the channel rate matcher comprises:
   a repeater for repeating the symbols outputted from the multiplexer to approximately match the symbol rate to the given channel symbol rate when a rate of the symbols outputted from the multiplexer is lower than the given channel symbol rate; and a puncturer for puncturing the repeated symbols to match a repeated symbol rate to the given channel symbol rate.

33. A channel coding method comprising the steps of:

inserting known bits in an input data bit stream at predetermined positions;

coding the bit-inserted data bit stream to generate coded symbols;

matching a rate of the coded symbols to a given channel symbol rate; and interleaving the rate matched channel symbols.

34. The channel coding method as claimed in claim 33, wherein the rate matching step comprises the step of puncturing the inserted known bits included in the coded symbols when the coded symbol rate is higher than the given channel symbol rate.

35. The channel coding method as claimed in claim 33, wherein the rate matching step comprises the step of repeating the coded symbols to match the coded symbol rate to the given channel symbol rate when the coded symbol rate is lower than the given channel symbol rate.

36. The channel coding method as claimed in claim 33, wherein the rate matching step comprises the steps of:

repeating the coded symbols to approximately match the coded symbol rate to the given channel symbol rate when the coded symbol rate is lower than the given channel symbol rate; and puncturing the repeated symbols to match a repeated symbol rate to the given channel symbol rate.

37. A channel coding method comprising the steps of:

inserting known bits in corresponding source user data bit streams at predetermined positions;

coding the bit-inserted user data bit streams to generate coded user symbols;

matching a rate of the user symbols to a given channel user symbol rate;

inserting known bits in a source control data bit stream at predetermined positions;

coding the bit-inserted control data bit stream to generate coded control symbols;

matching a rate of the control symbols to a given channel control symbol rate;

multiplexing an output of the first rate matcher and an output of the second rate matcher;

matching a rate of symbols outputted from the multiplexer to a given channel symbol rate; and interleaving output symbols of the channel rate matcher in a channel unit.

38. A channel coding method comprising the steps of:

inserting known bits in corresponding source user data bit streams at predetermined positions;

coding the bit-inserted user data bit streams to generate coded user symbols;

matching a rate of the user symbols to a given channel user symbol rate;

coding a source control data bit stream to generate coded control symbols;

matching a rate of the control symbols to a given channel control symbol rate;

multiplexing an output of the first rate matcher and an output of the second rate matcher;

matching a rate of symbols outputted from the multiplexer to a given channel symbol rate; and interleaving output symbols of the channel rate matcher in a channel unit.

* * * * *